United States Patent
Schatz et al.

(10) Patent No.: US 10,012,828 B2
(45) Date of Patent: Jul. 3, 2018

(54) ASSEMBLY BODY FOR MICROMIRROR CHIPS, MIRROR DEVICE AND PRODUCTION METHOD FOR A MIRROR DEVICE

(71) Applicant: Robert Bosch GmbH, Stuttgart (DE)

(72) Inventors: Frank Schatz, Kornwestheim (DE); Friedjof Heuck, Stuttgart (DE); Kerrin Doessel, Stuttgart (DE); Stefan Pinter, Reutlingen (DE); Daniel Pantel, Ditzingen (DE); Franziska Rohlfing, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 71 days.

(21) Appl. No.: 15/307,433

(22) PCT Filed: Apr. 27, 2015

(86) PCT No.: PCT/EP2015/059065
§ 371 (c)(1),
(2) Date: Oct. 28, 2016

(87) PCT Pub. No.: WO2015/169629
PCT Pub. Date: Nov. 12, 2015

(65) Prior Publication Data
US 2017/0052364 A1  Feb. 23, 2017

(30) Foreign Application Priority Data
May 7, 2014 (DE) .......... 10 2014 208 498

(51) Int. Cl.
G02B 7/182 (2006.01)
G02B 26/08 (2006.01)
(Continued)

(52) U.S. Cl.
CPC ........ *G02B 26/0833* (2013.01); *B81B 7/0067* (2013.01); *G02B 7/1821* (2013.01);
(Continued)

(58) Field of Classification Search
None
See application file for complete search history.

(56) References Cited

U.S. PATENT DOCUMENTS 7,002,727 B2    2/2006  Huibers
7,843,620 B2 *  11/2010 Pinter ............... G02B 26/0841
                                                        359/224.1
(Continued)

FOREIGN PATENT DOCUMENTS

CN         1758073 A      4/2006
CN       103245634 A      8/2013
(Continued)

OTHER PUBLICATIONS

International Search Report, dated Jul. 6, 2015, of the corresponding PCT Application PCT/EP2015/059065 filed Apr. 27, 2015.

*Primary Examiner* — Derek S Chapel
(74) *Attorney, Agent, or Firm* — Norton Rose Fulbright US LLP; Gerard Messina (57) ABSTRACT

An assembly body for micromirror chips that partly encloses an internal cavity, the assembly body including at two sides oriented away from one another, at least one respective partial outer wall that is fashioned transparent for a specified spectrum, and the assembly body having at least one first outer opening on which a first micromirror chip can be attached, and a second outer opening on which a second micromirror chip can be attached, in such a way that a light beam passing through the first partial outer wall is capable of being deflected by the first micromirror chip onto the second micromirror chip, and is capable of being deflected by the second micromirror chip through the second partial
(Continued)

outer wall. A mirror device and a production method for a mirror device are also described.

10 Claims, 5 Drawing Sheets

(51) Int. Cl.
*B81B 7/00* (2006.01)
*G02B 27/00* (2006.01)
*G02B 26/10* (2006.01)

(52) U.S. Cl.
CPC .... *G02B 27/0006* (2013.01); *B81B 2201/042* (2013.01); *G02B 26/101* (2013.01)

(56) References Cited

U.S. PATENT DOCUMENTS 9,285,668 B2 * 3/2016 Abele ................ G02B 26/0833
2002/0051053 A1 5/2002 Kawai

FOREIGN PATENT DOCUMENTS

| CN | 103630155 A | 3/2014 |
|---|---|---|
| DE | 102010062118 A1 | 5/2012 |
| DE | 102011120660 A1 | 5/2013 |
| EP | 712121 A2 | 5/1996 |
| WO | 2013139866 A1 | 9/2013 |

* cited by examiner

ASSEMBLY BODY FOR MICROMIRROR CHIPS, MIRROR DEVICE AND PRODUCTION METHOD FOR A MIRROR DEVICE

FIELD

The present invention relates to an assembly body for micromirror chips. The present invention also relates to a mirror device. In addition, the present invention relates to a production method for a mirror device.

BACKGROUND INFORMATION

German Patent Application No. DE 10 2010 062 118 A1 describes a covering device for a micro-optomechanical component and a production method for such a covering device. Using the covering device, a micro-optomechanical component, such as a chip with a micromirror fashioned thereon, can be covered. The covering device includes at least one window made of a material transparent to light that is fastened on a substrate in such a way that at least one opening running through the substrate can be sealed by the respective window. The at least one window is oriented inclined to a maximum surface of the substrate.

SUMMARY

The present invention provides an assembly body for micromirror chips, a mirror device, and a production method for a mirror device.

The present invention includes advantageous specific embodiments for a package for the easily realizable assembly of micromirror chips. As explained in more detail below, after an assembly of the two micromirror chips on the assembly body it is automatically ensured that reflections of the light beam deflected by the two micromirror chips at the two partial outer walls are automatically kept out of a light projected by the light beam. In particular, the two partial outer walls are situated in such a way relative to the two micromirror chips attached on the assembly body that reflections occurring at the two partial outer walls do not bring about any undesirable light points close to an impinge point of the light beam deflected by the two micromirror chips. At the same time, the production of the assembly body/the mirror device is facilitated in such a way that easier method steps for this purpose can be carried out. Thus, the production costs for the assembly body/the mirror device are reduced by the present invention.

Moreover, using the present invention the micromirror chips can be positioned on a sealed-off space in such a way that it can be ensured that the micromirror chips are kept free of dust and moisture. Depending on the type of production, a vacuum or a special gas having a specified pressure can also be enclosed in the sealed-off space with the micromirror chips attached thereon. In particular, the presence of a vacuum in the environment of the micromirror chip attached on the assembly body facilitates its adjustability.

In a first advantageous specific embodiment, the assembly body has a first cuboidal wall having the first partial outer wall fashioned thereon, a second cuboidal wall having the second partial outer wall fashioned thereon, and an intermediate frame situated between the first cuboidal wall and the second cuboidal wall. Such an assembly body is comparatively easy to assemble from the (easily producible) components listed here.

Preferably, the first cuboidal wall and the second cuboidal wall are made completely of a material that is transparent for the specified spectrum. Thus, given an assembly body fashioned in such a way, the conventional working outlay for attaching a window made of a transparent material to a housing frame is omitted.

For example, the first outer opening can be fashioned on the second cuboidal wall and the second outer opening can be fashioned on the first cuboidal wall. Through such a positioning of the two outer openings (or the two micromirror chips) relative to the two partial outer walls, which are transferred by the light beam deflected at the two micromirror chips, reflections of the light beam at the two partial outer walls are automatically kept away from a light impinge point of the light beam.

In a second advantageous specific embodiment, the assembly body has a hollow profile on which the first partial outer wall and the second partial outer wall are fashioned and which frames the internal cavity extending from the first outer opening to the second outer opening. Such an assembly body is also easily producible at low cost.

For example, the hollow profile can be an oblique hollow profile. In this way, a multiplicity of possibilities is ensured in the orientation of the two outer openings (or the two micromirror chips) relative to the two partial outer walls.

The hollow profile can be made completely of at least one material transparent for the specified spectrum. Particularly advantageous possibilities for producing such a hollow profile are described further below.

In an advantageous development, the assembly body can also include at least one externally situated contacting unit. Through the external situation of the at least one contacting unit, its assembly on the assembly body is facilitated.

The advantages described above are also ensured in a corresponding mirror device.

In addition, the advantages described above can be realized by executing the corresponding production method for a mirror device. It is to be noted that the production method can be further developed according to the specific embodiments explained above of the assembly body.

BRIEF DESCRIPTION OF THE DRAWINGS

Further features and advantages of the present invention are explained below based on the Figures.

DETAILED DESCRIPTION OF EXAMPLE EMBODIMENTS

Figure 1A:
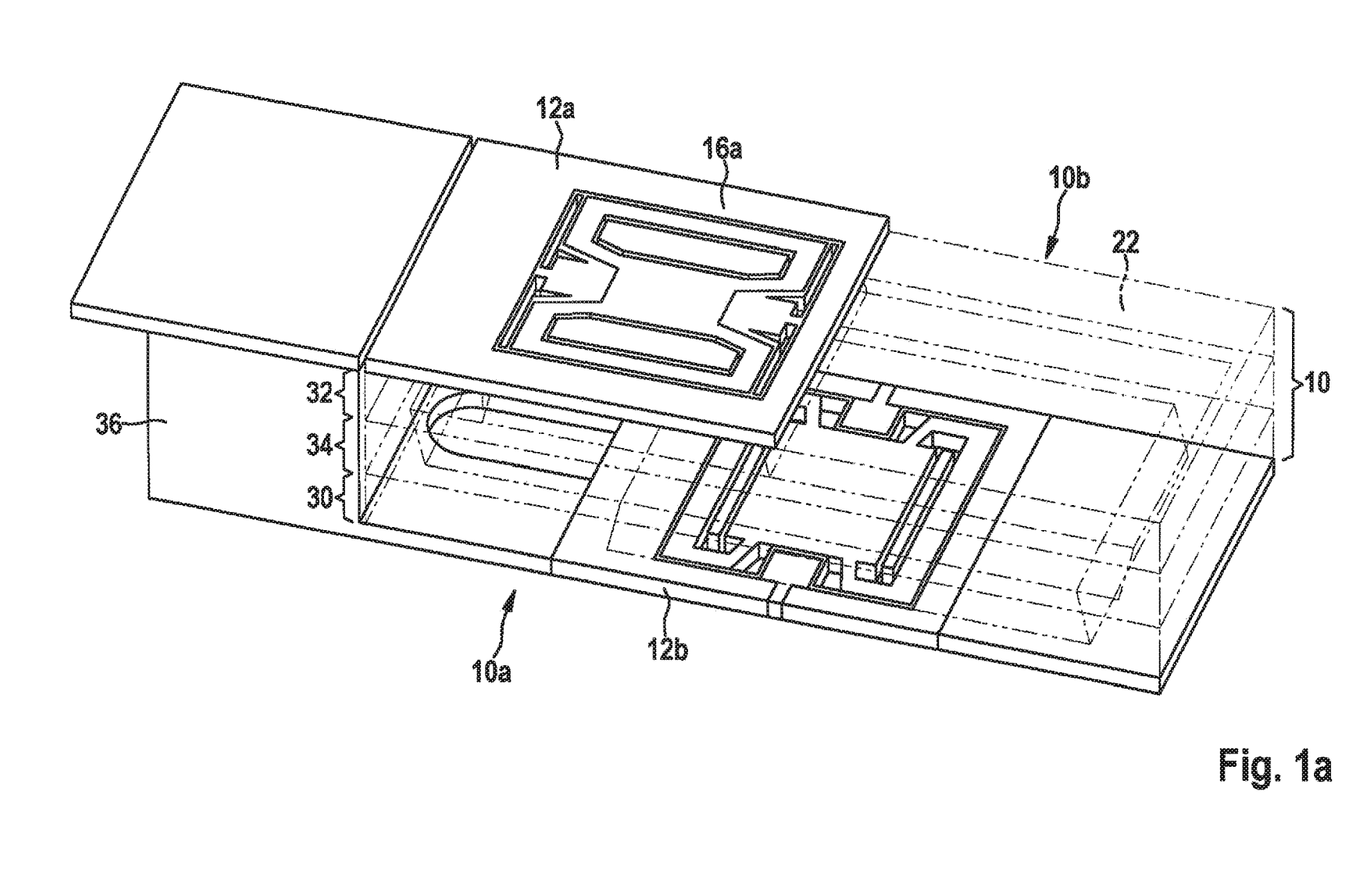
FIGS. 1a through 1c show schematic representations of a first specific embodiment of the mirror device, FIGS. 1a and 1b showing side views and FIG. 1c showing a cross-section.
Figure 1B:
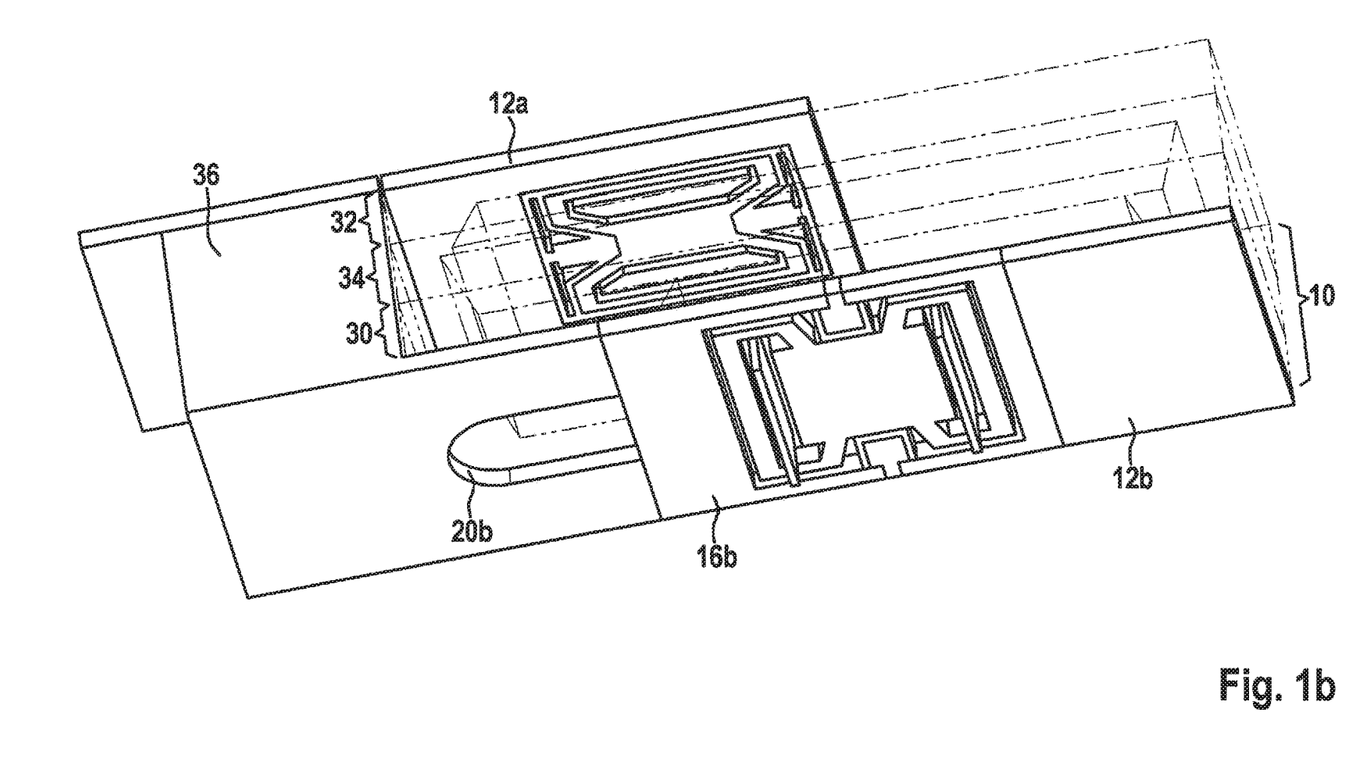
Figure 1C:
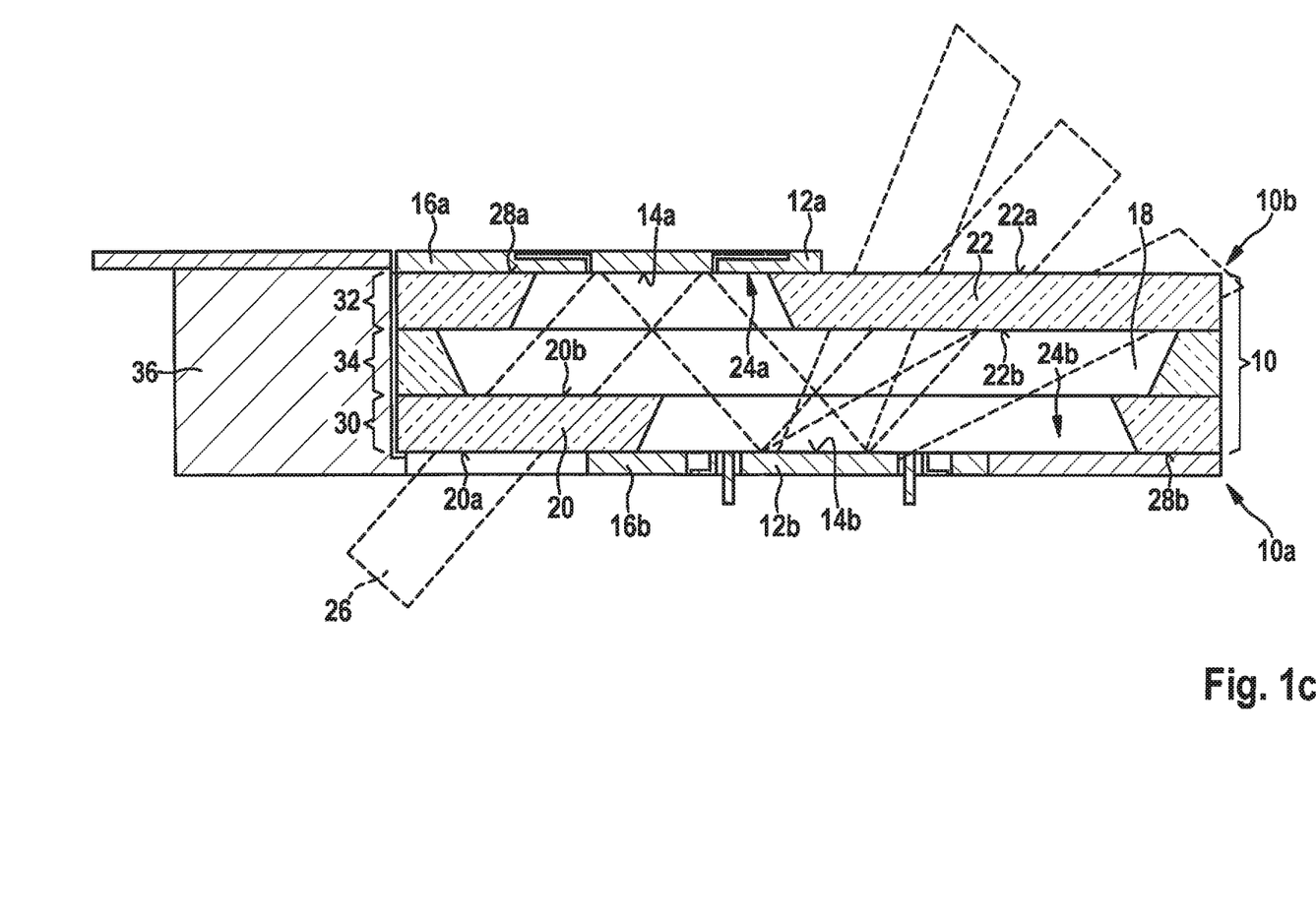

FIGS. 1a through 1c show schematic representations of a first specific embodiment of the mirror device, FIGS. 1a and 1b showing side views and FIG. 1c showing a cross-section.

The mirror device shown in FIGS. 1a through 1c includes an assembly body 10, a first micromirror chip 12a, and a second micromirror chip 12b. Micromirror chips 12a and 12b can also be designated MEMS micromirrors 12a and 12b. On each of the two micromirror chips 12a and 12b there can be fashioned a respective surface 14a and 14b that reflects a specified spectrum. Optionally, the reflective surface 14a and 14b of a micromirror chip 12a and 12b can be adjustable about at least one axis of rotation (not shown) relative to a mount 16a and 16b of the same micromirror chip 12a and 12b. For example, first reflective surface 14a of first micromirror chip 12a can be adjusted about a first axis of rotation relative to first mount 16a, while second reflective surface 14b of second micromirror chip 12b can be adjusted about a second axis of rotation, oriented inclined to the first axis of rotation, relative to second mount 16b. In particular, in this case the first axis of rotation and the second axis of rotation can be oriented perpendicular to one another. Alternatively, however, it is also possible for only one of the two micromirror chips 12a or 12b to have a reflective surface 14a and 14b adjustable about two axes of rotation, while for the other of the two micromirror chips 12a and 12b reflective surface 14a or 14b fashioned thereon is not adjustable relative to the respective mount 16a or 16b.

Assembly body 10 partly encloses an internal cavity 18. Moreover, assembly body 10 includes, at two sides 10a and 10b oriented away from one another, respectively at least one partial outer wall 20 and 22 made transparent for the specified spectrum. The transparent fashioning of each partial outer wall 20 and 22 can be understood as meaning that the respective partial outer wall 20 and 22, going out from an outer surface 20a and 22a oriented away from internal cavity 18 up to an inner surface 20b and 22b partly limiting internal cavity 18, is transparent/permeable at least for a wavelength within the specified spectrum. This can also be described by saying that each of the two partial outer walls 20 and 22 has a comparatively high transmission coefficient, or a relatively low reflection coefficient, for a wavelength from the specified spectrum. The specified spectrum can lie for example in the visible light spectrum, in the infrared range, and/or in the UV range.

Assembly body 10 has a first outer opening 24a on which first micromirror chip 12a can be attached/is attached. Moreover, assembly body 10 has at least a further second outer opening 24b on which second micromirror chip 12b can be attached/is attached. The two outer openings 24a and 24b are situated relative to the two partial outer walls 20 and 22 in such a way that a light beam 26 passing through the first partial outer wall 20 impinges on first micromirror chip 12a attached on first outer opening 24a, and can be deflected by first micromirror chip 12a onto second micromirror chip 12b attached on second outer opening 24a. Preferably, light beam 26 transmitted through first partial outer wall 20 impinges on first reflective surface 14a of first micromirror chip 12a attached on first outer opening 24a, and is deflected thereby onto second reflective surface 14b of second micromirror chip 12b attached on second outer opening 24a. In addition, the same light beam 26 is capable of being deflected by second micromirror chip 12b, attached on second outer opening 24b, through second partial outer wall 22.

Preferably, at least one of the micromirror chips 12a and 12b is fastened on assembly body 10 in such a way that the respective micromirror chip 12a and 12b covers the outer opening 24a and 24b assigned thereto. For this purpose, the respective micromirror chip 12a and 12b can be fastened on an outer surface 28a and 28b, framing the respective outer opening 24a and 24b, of the assembly body. Internal cavity 18 can thus be a sealed-off space (at least after the fastening of the two micromirror chips 12a and 12b). For the parts of micromirror chips 12a and 12b extending into outer openings 24a and 24b, in particular for reflective surfaces 14a and 14b, this ensures protection against moisture and contamination (such as dust). Wetting/contamination of reflective surfaces 14a and 14b during operation of the mirror device is therefore reliably prevented. Moreover, in internal cavity 18, fashioned as a sealed-off space, low pressure, in particular a vacuum, can be present, thereby improving an adjustability of reflective surfaces 14a and 14b. If desired, a specific gas having a specified/defined pressure can be filled into internal cavity 18 fashioned as a sealed-off space.

In the specific embodiment of FIGS. 1a through 1c, assembly body 10 has a first cuboidal wall 30 on which first partial outer wall 20 is fashioned, and a second cuboidal wall 32 having second partial outer wall 22 fashioned thereon. An intermediate frame 34 is situated between first cuboidal wall 30 and second cuboidal wall 32. This can also be described by saying that first cuboidal wall 30 is connected to second cuboidal wall 32 via intermediate frame 34. Assembly body 10 can be designated a plane-parallel assembly body 10.

First cuboidal wall 30 and/or second cuboidal wall 32 can be made completely of at least one material transparent for the specified spectrum. First cuboidal wall 30 and/or cuboidal wall 32 can be made for example of glass. Intermediate frame 34 can be made for example of glass or of silicon. However, the materials named here are to be interpreted only as examples.

In the specific embodiment of FIGS. 1a through 1c, first outer opening 24a is fashioned on second cuboidal wall 32 and second outer opening 24b is fashioned on first cuboidal wall 30. Light beam 26 thus enters into assembly body 10 at a first side 10a of the two sides 10a and 10b oriented away from one another, and leaves assembly body 10 at second side 10b of the two sides 10a and 10b oriented away from one another. A reflection of light beam 26 on first partial outer wall 20 is thus automatically directed away from light beam 26 leaving assembly body 10. A reflection of the light beam directed onto second partial outer wall 22 by second micromirror chip 12b also impinges, at a distance from second reflective surface 14b, on second mount 16b of second micromirror chip 12b or on first cuboidal wall 30. In this way, undesired reflection points in an image projected by deflected light beam 26 are reliably prevented.

It will be noted that in the mirror device of FIGS. 1a through 1c, a size of assembly body 10 makes unnecessary a formation of inclined window surfaces thereon. This simplifies the production of assembly body 10/of the mirror device. Assembly body 10/the mirror device can be produced in particular at the wafer level.

Light beam 26 deflected by the mirror device only has to pass through each of the two partial outer walls 20 and 22 once. This reduces the reflection losses when there is a deflection of light beam 26 by the mirror device. Frequently, a reduction of reflection losses by 50% (based on the halving of the pass-through surfaces) can be achieved. Optionally, at least outer surface 20a of first partial outer wall 20 and/or inner surface 22b of second partial outer wall 22 can be covered with an anti-reflective coating.

It will be noted that in the specific embodiment of FIGS. 1a through 1c, a comparatively large amount of open space is present in the environment around reflective surfaces 14a and 14b of micromirror chips 12a and 12b. Moreover, the spacing of micromirror chips 12a and 12b in the mirror device of FIGS. 1a through 1c can be chosen more freely compared to the existing art. In this way adequate free space is present in the mirror device even for an adjustment of a comparatively large reflective surface 14a and 14b. This enables a large design of second reflective surface 14b of second micromirror chip 12b, on which light beam 26, already expanded at first reflective surface 14a of first micromirror chip 12a, impinges.

The mirror device of FIGS. 1a through 1c also has a contacting unit 36 situated externally on assembly body 10.

Figure 2:
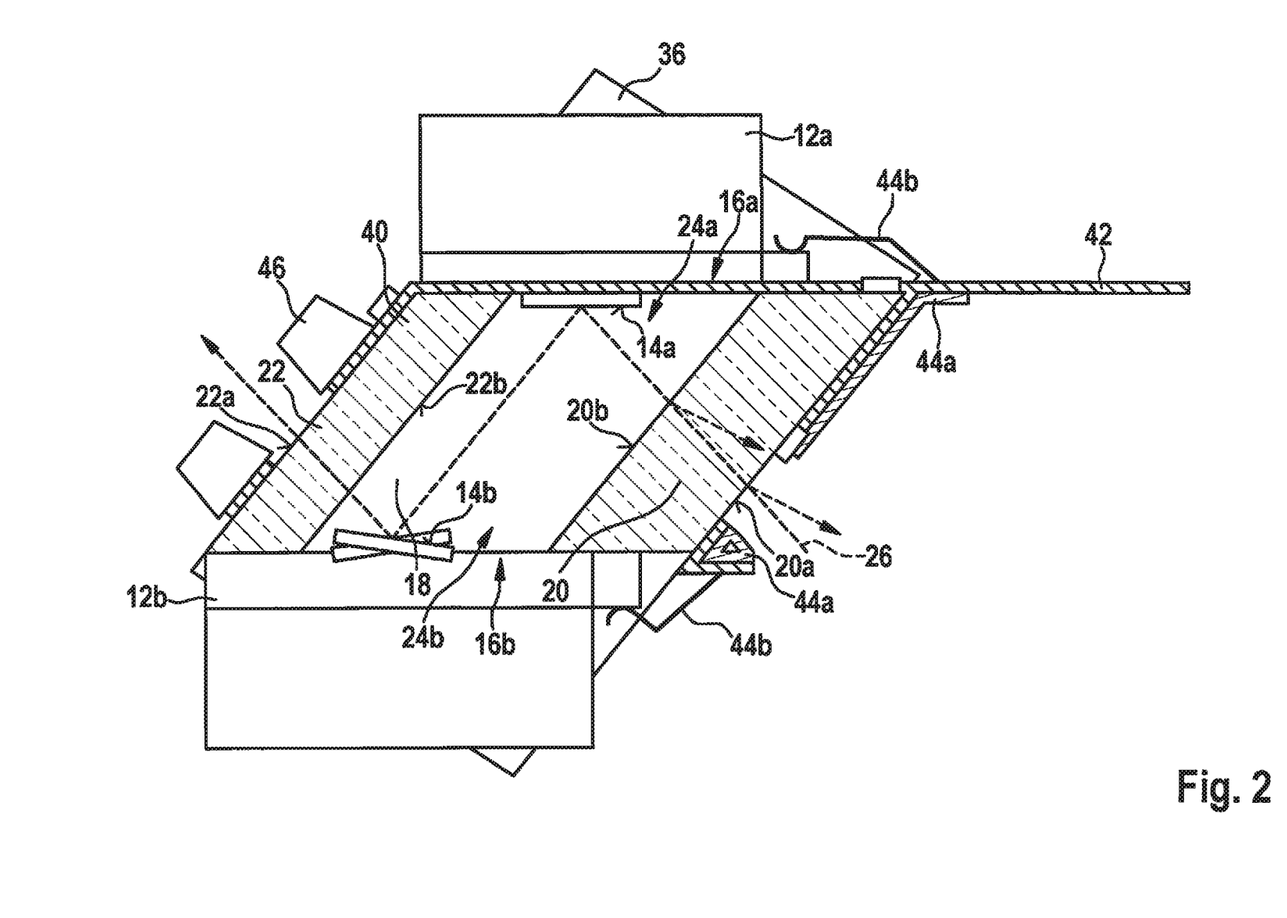
FIG. 2 shows a schematic representation of a second specific embodiment of the mirror device.

FIG. 2 shows a schematic representation of a second specific embodiment of the mirror device.

In the mirror device shown schematically in FIG. 2, assembly body 40 has a hollow profile 40 on which first partial outer wall 20 and second partial outer wall 22 are fashioned. In particular, hollow profile 40 can be assembly body 40. Hollow profile 40 frames internal cavity 18 extending from first outer opening 24a to second outer opening 24b.

In the specific embodiment of FIG. 2, hollow profile 40 is an oblique hollow profile 40. Moreover, hollow profile 40 can be made completely of at least one material transparent for the specified spectrum. For example, hollow profile 40 is made of glass.

Hollow profile 40/assembly body 40 can be covered externally at least partly with a protective layer/insulating layer 42 on which at least one contacting element 44a and 44b are fashioned, which electrically connects at least one micromirror chip 12a and 12b with contacting unit 36 situated externally on assembly body 40. Optionally, hollow profile 40/assembly body 40 can bear a screen 46 adjacent to second partial outer wall 22.

In all mirror devices described above, reflection losses occurring during deflection of light beam 26 are comparatively low. The mirror devices described above can therefore advantageously be used as scanners or as projectors (pico projectors). In particular, the mirror devices can be integrated in standalone devices, in mobile telephones, in head-up systems, in laptops, in tablets, or in camcorders.

Figure 3A:
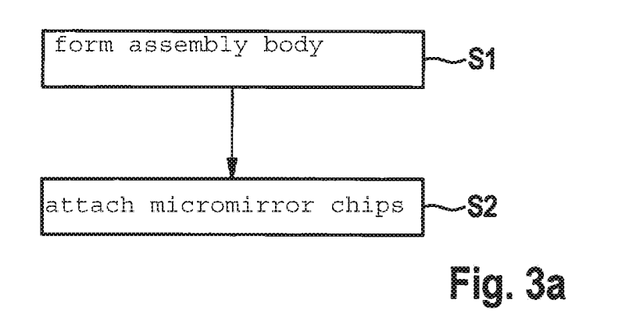
FIGS. 3a and 3b show a flow diagram and a cross-section through an assembly body for explaining a specific embodiment of the production method for a mirror device.
Figure 3B:
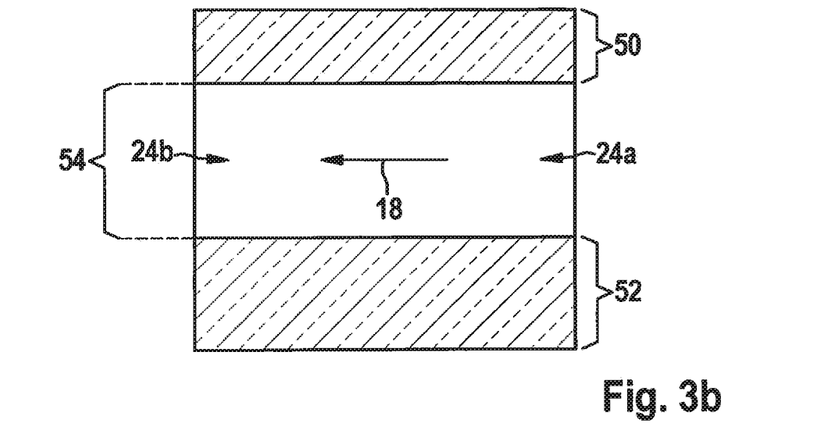

FIGS. 3a and 3b show a flow diagram and a cross-section through an assembly body for the explanation of a specific embodiment of the production method for a mirror device.

Using the production method described below, for example the mirror devices described above can be produced. However, it will be noted that the realizability of the production method is not limited to the production of such mirror devices.

In a method step S1, an assembly body is formed that partially encloses an internal cavity. The assembly body is fashioned, at two sides oriented away from one another, at least with a respective partial outer wall transparent for a specified spectrum. In particular, the assembly body can be fashioned completely of at least one material transparent for the specified spectrum. Moreover, the assembly body is fashioned having at least one first outer opening and having at least one second outer opening.

For example, the assembly body can be assembled from a first cuboidal wall having the first partial outer wall fashioned thereon, a second cuboidal wall having the second partial outer wall fashioned thereon, and an intermediate frame, the intermediate frame being situated between the first cuboidal wall and the second cuboidal wall. Given previously executed structuring of the two cuboidal walls and of the intermediate frame situated between them, material can be removed everywhere where either a micromirror chip is to be mounted or where the internal cavity is advantageous for guiding the light beam. The structuring of the two cuboidal walls and/or of the intermediate frame situated between them can take place by sandblasting or by stamping/hot stamping. The two cuboidal walls can for example be made of glass, in particular structurable glass, or of a non-transparent material such as e.g., silicon. The connection of the two cuboidal walls to the intermediate frame can be created through a sealed glass bonding, a direct bonding of silicon and glass, or a direct bonding of glass and glass. However, the methods listed here are to be interpreted only as examples.

In an alternative specific embodiment of method step S1, however, the assembly body can also be produced (at least partly) as a hollow profile having the first partial outer wall fashioned thereon and the second partial outer wall fashioned thereon. In this case, the hollow profile frames the internal cavity extending from the first outer opening to the second outer opening.

As can be seen on the basis of FIG. 3b, the hollow profile can be produced by fashioning a channel 18 between an upper plane 50 and a lower plane 52 as internal cavity 18, extending from first outer opening 24a to second outer opening 24b. Channel 18 can for example be fashioned by sandblasting. In particular a middle plane 54 made of glass, present between upper plane 50 and lower plane 52, can easily be removed in this way. Specifically, a hollow profile fashioned as an assembly body, or a hollow assembly body, can easily be produced given such a specific embodiment of method step S1. In an alternative specific embodiment, however, the hollow profile can also be produced from the at least one transparent material using a lithography step or an embossing/hot embossing.

In a second method step S2, a first micromirror chip is attached on the first outer opening and a second micromirror chip is attached on the second outer opening. The micromirror chips can for example be fixedly glued or fixedly bonded on the assembly body. Examples of the micromirror chips that can be used for this purpose have been described above.

The assembly of the micromirror chips on the assembly body can take place at the wafer level. If the micromirror chips fashioned on a wafer at the optical pass-through surfaces are not connected to the base body, the wafer material present there can easily be removed through a suitable trench or a suitable sawing method. Alternatively, before the assembly of the micromirror chips a separation of the micromirror chips can take place, and the already separated micromirror chips can be attached on the (separated) assembly body, or on a wafer with assembly bodies fashioned thereon, using pick-and-place.

In method steps S1 and S2, the fashioning of the first outer opening and of the second outer opening, and the attaching of the first micromirror chip and of the second micromirror chip, takes place in such a way that given operation of the mirror device a light beam passing through a first partial outer wall of the two partial outer walls is deflected by the first micromirror chip onto the second micromirror chip and is deflected by the second micromirror chip through a second partial outer wall of the two partial outer walls.

If a vacuum is desired in the internal cavity, the micromirror chips can be bonded onto the assembly body under vacuum. In order to produce low pressure or a vacuum in the hollow space, however, a further (comparatively small-surface) opening (in addition to the first outer opening and the second outer opening) can also be fashioned on the assembly body in method step S1. The desired low pressure or the preferred vacuum can in this case be set only after the attaching of the micromirror chips on the assembly body. For this purpose, first air is pumped out from the internal cavity. Subsequently, the opening can be welded shut under low pressure/vacuum, for example using a laser.

In a development, at least one contacting unit is further fastened on the assembly body. Preferably, the at least one contacting unit is attached thereto only after a separation of the mirror devices. In particular, the contacting element can also be attached at an entry side of the assembly body, and the contacting can take place through a wire bonding.

The at least one contacting unit can be produced for example on the basis of circuit board material. A contacting of the micromirror chip can take place through a wire bonding of the circuit board on the micromirror chip.

A through-contacting for the simplified guiding away of lines (e.g., through a flexible circuit board) preferably takes place in the circuit board material.

In all specific embodiments described here, protection of the reflective surfaces of the two micromirror chips is possible already in an early stage of the production of the mirror device. Moreover, the mirror devices that can be produced using the method described here offer the advantages already explained above.

What is claimed is:

1. An assembly body for micromirror chips partially enclosing an internal cavity, the assembly body comprising:
    at two sides of the assembly body oriented away from one another, a respective partial outer wall that is made transparent for a specified spectrum;
    at least one first outer opening on which a first micromirror chip can be attached; and
    a second outer opening on which a second micromirror chip can be attached;
    wherein the assembly body is configured in such a way that a light beam passing through a first partial outer wall of the two partial outer walls is capable of being deflected by the first micromirror chip attached on the first outer opening, onto the second micromirror chip attached on the second outer opening, and is capable of being deflected by the second micromirror chip attached on the second outer opening through a second partial outer wall of the two partial outer walls.

2. The assembly body as recited in claim 1, wherein the assembly body includes a first cuboidal wall having the first partial outer wall fashioned thereon, a second cuboidal wall having the second partial outer wall fashioned thereon, and an intermediate frame situated between the first cuboidal wall and the second cuboidal wall.

3. The assembly body as recited in claim 2, wherein at least one of the first cuboidal wall and the second cuboidal wall is formed completely of at least one material transparent for the specified spectrum.

4. The assembly body as recited in claim 2, wherein the first outer opening is fashioned on the second cuboidal wall and the second outer opening is fashioned on the first cuboidal wall.

5. The assembly body as recited in claim 1, wherein the assembly body has a hollow profile on which the first partial outer wall and the second partial outer wall are fashioned, and which frames the internal cavity extending from the first outer opening to the second outer opening.

6. The assembly body as recited in claim 5, wherein the hollow profile is an oblique hollow profile.

7. The assembly body as recited in claim 5, wherein the hollow profile is formed completely of at least one material transparent for the specified spectrum.

8. The assembly body as recited in claim 1, wherein the assembly body includes at least one externally situated contacting unit.

9. A mirror device, comprising:
    an assembly body for micromirror chips partially enclosing an internal cavity, the assembly body having, at two sides of the assembly body oriented away from one another, a respective partial outer wall that is made transparent for a specified spectrum, the assembly further having at least one first outer opening on which a first micromirror chip can be attached, and a second outer opening on which a second micromirror chip can be attached, wherein the assembly body is configured in such a way that a light beam passing through a first partial outer wall of the two partial outer walls is capable of being deflected by the first micromirror chip attached on the first outer opening, onto the second micromirror chip attached on the second outer opening, and is capable of being deflected by the second micromirror chip attached on the second outer opening through a second partial outer wall of the two partial outer walls;
    the first micromirror chip attached on the first outer opening of the assembly body; and
    the second micromirror chip attached on the second outer opening of the assembly body.

10. A production method for a mirror device, comprising:
    forming an assembly body that partly encloses an internal cavity, the assembly body having, at two sides oriented away from one another, a respective partial outer wall that is transparent for a specified spectrum, and the assembly body being fashioned having at least one first outer opening and having a second outer opening; and
    attaching a first micromirror chip on the first outer opening and of a second micromirror chip on the second outer opening;
    wherein the fashioning of the first outer opening and of the second outer opening and the attaching of the first micromirror chip and of the second micromirror chip take place in such a way that when there is an operation of the mirror device, a light beam passing through a first partial outer wall of the two partial outer walls is deflected by the first micromirror chip onto the second micromirror chip, and is deflected by the second micromirror chip through a second partial outer wall of the two partial outer walls.

* * * * *